(12) United States Patent
Suzuki et al.

(10) Patent No.: US 9,893,280 B2
(45) Date of Patent: Feb. 13, 2018

(54) MEMORY DEVICE

(71) Applicant: Toshiba Memory Corporation, Minato-ku (JP)

(72) Inventors: Kunifumi Suzuki, Yokohama (JP); Junji Tominaga, Tsukuba (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/793,891

(22) Filed: Jul. 8, 2015

(65) Prior Publication Data

US 2016/0233421 A1 Aug. 11, 2016

Related U.S. Application Data

(60) Provisional application No. 62/112,898, filed on Feb. 6, 2015.

(51) Int. Cl.
*H01L 45/00* (2006.01)
*H01L 27/24* (2006.01)

(52) U.S. Cl.
CPC ........ *H01L 45/144* (2013.01); *H01L 27/2463* (2013.01); *H01L 45/065* (2013.01); *H01L 45/1233* (2013.01); *H01L 27/2409* (2013.01); *H01L 27/2436* (2013.01)

(58) Field of Classification Search
CPC ..................................................... H01L 45/00

USPC .......................................................... 257/2–5
See application file for complete search history.

(56) References Cited

U.S. PATENT DOCUMENTS

| | | | |
|---|---|---|---|
| 8,335,106 B2 | 12/2012 | Aizawa et al. | |
| 2004/0245517 A1 | 12/2004 | Campbell et al. | |
| 2011/0315942 A1 | 12/2011 | Tominaga et al. | |
| 2013/0221310 A1* | 8/2013 | Morikawa ............. | H01L 45/144 257/2 |

FOREIGN PATENT DOCUMENTS

| JP | 2010-183017 | 8/2010 |
|---|---|---|
| JP | 2011-82316 | 4/2011 |

OTHER PUBLICATIONS

Office Action dated Nov. 11, 2016 in Taiwanese Patent Application No. 104129064 (with English Translation).

* cited by examiner

*Primary Examiner* — Marvin Payen
(74) *Attorney, Agent, or Firm* — Oblon, McClelland, Maier & Neustadt, L.L.P.

(57) ABSTRACT

A memory device according to an embodiment includes an insulating layer containing silicon, an interface layer provided on the insulating layer and containing a chalcogenide compound of a transition metal, and a conductive layer provided on the interface layer, containing antimony or bismuth, and having a superlattice structure.

18 Claims, 11 Drawing Sheets

MEMORY DEVICE

CROSS-REFERENCE TO RELATED APPLICATIONS

This application is based upon and claims the benefit of priority from U.S. Provisional Patent Application 62/112,898, filed on Feb. 6, 2015; the entire contents of which are incorporated herein by reference.

FIELD

Embodiments described later relate generally to a memory device.

BACKGROUND

In recent years, a resistance change memory (ReRAM) using film resistance change is developed. As one kind of the ReRAM, a phase change memory (PRAM) using resistance value change caused by thermal phase transition between a crystalline state and an amorphous state in a film storage area is developed. Especially, a superlattice PRAM in which two different alloys are repeatedly stacked attracts attention as a memory device in which power saving is easily achieved, because phase of the film can be changed by a small current.

DETAILED DESCRIPTION

A memory device according to an embodiment, includes an insulating layer containing silicon, an interface layer provided on the insulating layer and containing a chalcogenide compound of a transition metal; and a conductive layer provided on the interface layer, containing antimony or bismuth, and having a superlattice structure.

Hereinafter, embodiments of the invention will be described with reference to the drawings.

(First Embodiment)

First, a first embodiment will be described with reference to FIGS. 1, 2, 3A and 3B.

A memory device of this embodiment is a superlattice phase change memory (PRAM).

Figure 1:
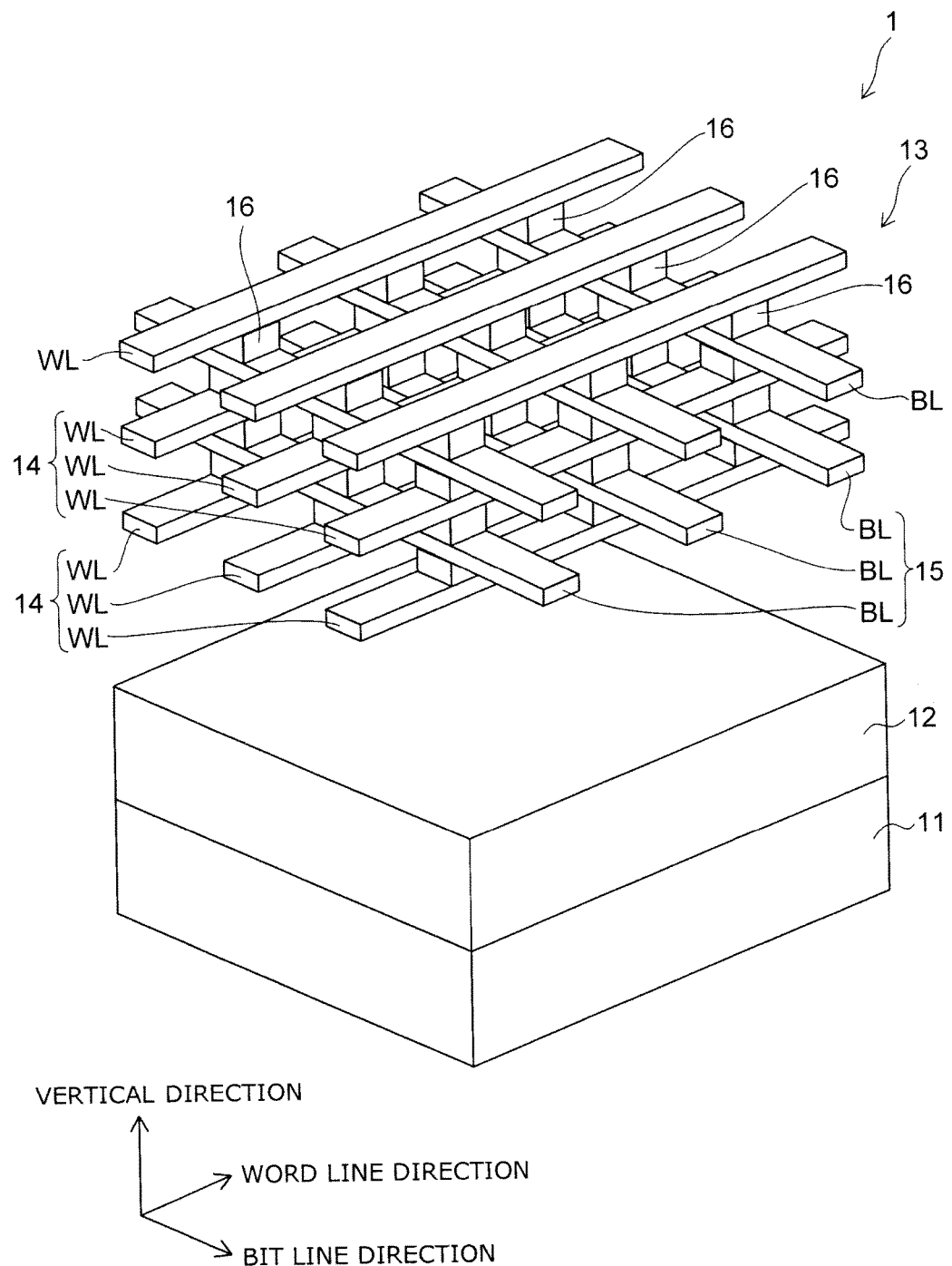
FIG. 1 is a perspective view showing a memory device according to a first embodiment.

As shown in FIG. 1, a silicon substrate 11 is provided in a memory device 1 of this embodiment. An interlayer insulating film 12 made of, for example, silicon oxide is provided on the silicon substrate 11, and a memory cell unit 13 is provided on the interlayer insulating film 12.

In the memory cell unit 13, a word line interconnection layer 14 including plural word lines WL extending in one direction (hereinafter referred to as "word line direction") parallel to an upper surface of the silicon substrate 11 and a bit line interconnection layer 15 including plural bit lines BL extending in a direction (hereinafter referred to as "bit line direction") crossing, for example, perpendicular to the word line direction are alternately stacked through an interlayer insulating film 17 (see FIG. 2). The word lines WL, the bit lines BL, or the word line WL and the bit line BL do not mutually contact each other. The word lines WL and the bit lines BL are made of, for example, metal such as copper (Cu), aluminum (Al) or tungsten (W).

A pillar 16 extending in a direction (hereinafter referred to as "vertical direction") perpendicular to the upper surface of the silicon substrate 11 is provided at the closest point between each of the word lines WL and each of the bit lines BL. The pillar 16 is formed between the word line WL and the bit line BL. The one pillar 16 constitutes one memory cell. That is, the memory device 1 is a cross point type device in which the memory cell is disposed at each of the closest points between the word lines WL and the bit lines BL. An interwiring insulating film (not shown) is provided between the respective word lines WL, and an inter-interconnection insulating films 18 (see FIG. 2) is provided also between the respective bit lines BL.

Figure 2:
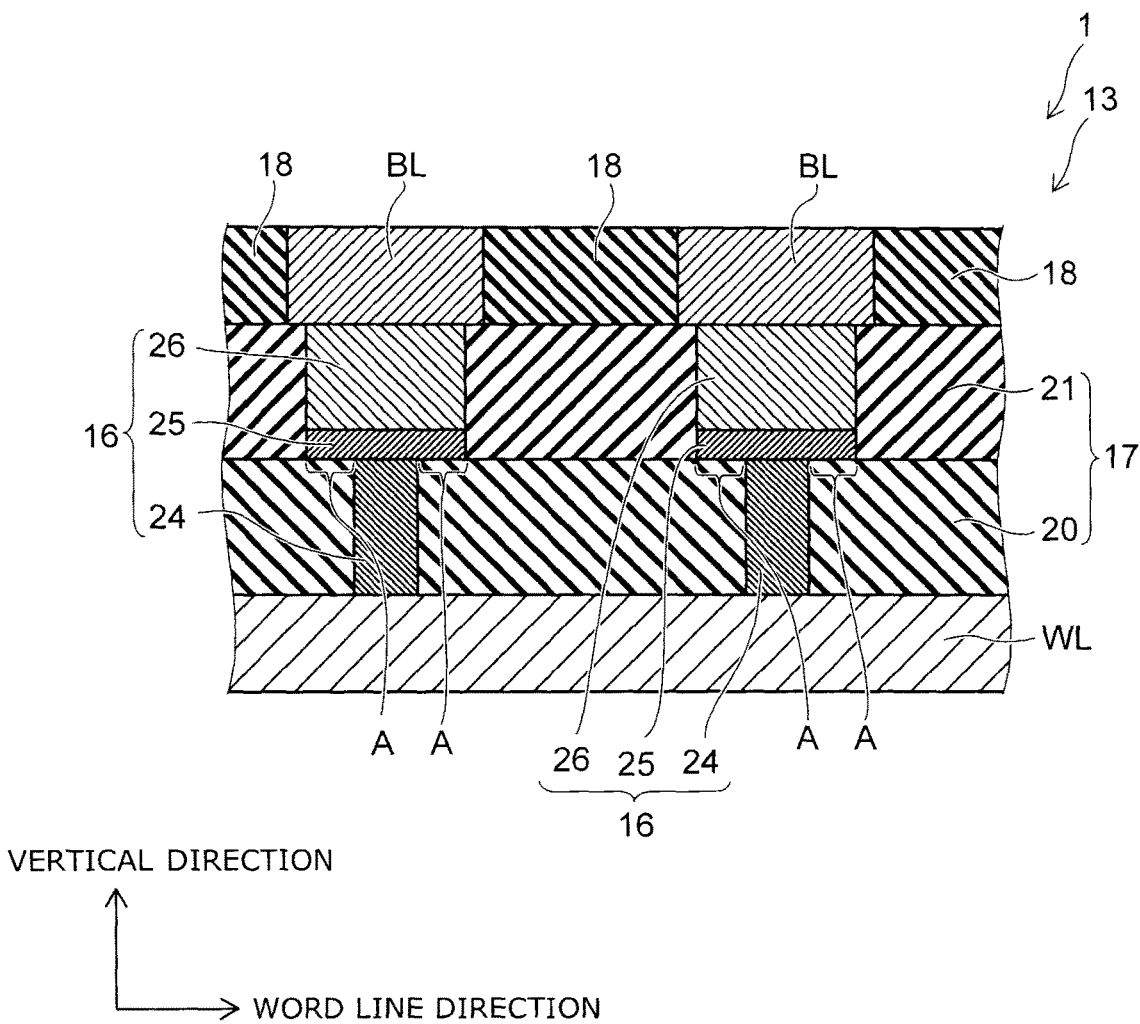
FIG. 2 is a sectional view showing a memory unit a memory device according to the first embodiment.

As shown in FIG. 2, in the interlayer insulating film 17, silicon oxide films 20 and 21 made of silicon oxide are stacked in this order. Besides, in each of the pillars 16, an electrode 24, an interface layer 25 and a resistance change layer 26 are stacked in this order.

The electrode 24 pierces the silicon oxide film 20 in the vertical direction. The electrode 24 is connected to the word line WL. The electrode 24 is made of, for example, conductive material such as titanium nitride (TiN), tungsten, copper or aluminum.

The interface layer 25 and the resistance change layer 26 contact each other. Thus, the interface layer 25 is disposed on the silicon oxide film 20 as an insulating layer. A stacked body including the interface layer 25 and the resistance change layer 26 pierces the silicon oxide film 21 in the vertical direction. A lower surface of the interface layer 25 contacts an upper surface of the electrode 24, and an upper surface of the resistance change layer 26 contacts a lower surface of the bit line BL. Incidentally, a barrier metal layer or the like may intervene between the resistance change layer 26 and the bit line BL. When viewed from the vertical direction, the interface layer 25 and the resistance change layer 26 are larger than the electrode 24. Thus, a part of the lower surface of the interface layer 25 contacts an upper surface of the silicon oxide film 20 in an area A. As seen from the vertical direction, the electrode 24 is disposed inside the interface layer 25 and is surrounded with the area A.

The interface layer 25 is made of a chalcogenide compound of a transition metal. The chalcogenide compound is a compound of one or more kinds of transition metals selected from a group consisting of titanium (Ti), vanadium (V), copper (Cu), zinc (Zn), chromium (Cr), zirconium (Zr), platinum (Pt), palladium (Pd), molybdenum (Mo), nickel (Ni), manganese (Mn) and hafnium (Hf) and one or more kinds of chalcogen elements selected from a group consisting of sulfur (S), selenium (Se) and tellurium (Te). More preferably, when M denotes the transition metal, and X denotes the chalcogen element, the chalcogenide compound is the compound whose composition is expressed by a chemical formula MX or $MX_2$, for example. When the composition is MX, the concentration of the transition metal M in the chalcogenide compound is around 50 atom %. When the composition is $MX_2$, the concentration of the transition metal M is around 33 atom %. Since the composition of the compound can have some range, the preferable concentration of the transition metal M of the chalcogenide compound is 20 atom % or more and 60 atom % or less. In the embodiment, the chalcogenide compound is, for example, $TiTe_2$.

The resistance change layer 26 is formed of a superlattice structure in which plural chalcogenide compound layers are stacked. The superlattice structure indicates a crystal lattice in which plural kinds of crystal lattices are stacked and the periodic structure thereof is longer than the basic unit lattice. The chalcogenide compound used for the resistance change layer 26 includes two or more chalcogenide compounds, for example, antimony tellurium such as $Sb_2Te_3$ and germanium tellurium such as GeTe. In order to stabilize the phase change, one of the chalcogenide compounds preferably includes antimony (Sb) or bismuth (Bi).

Figure 3A:
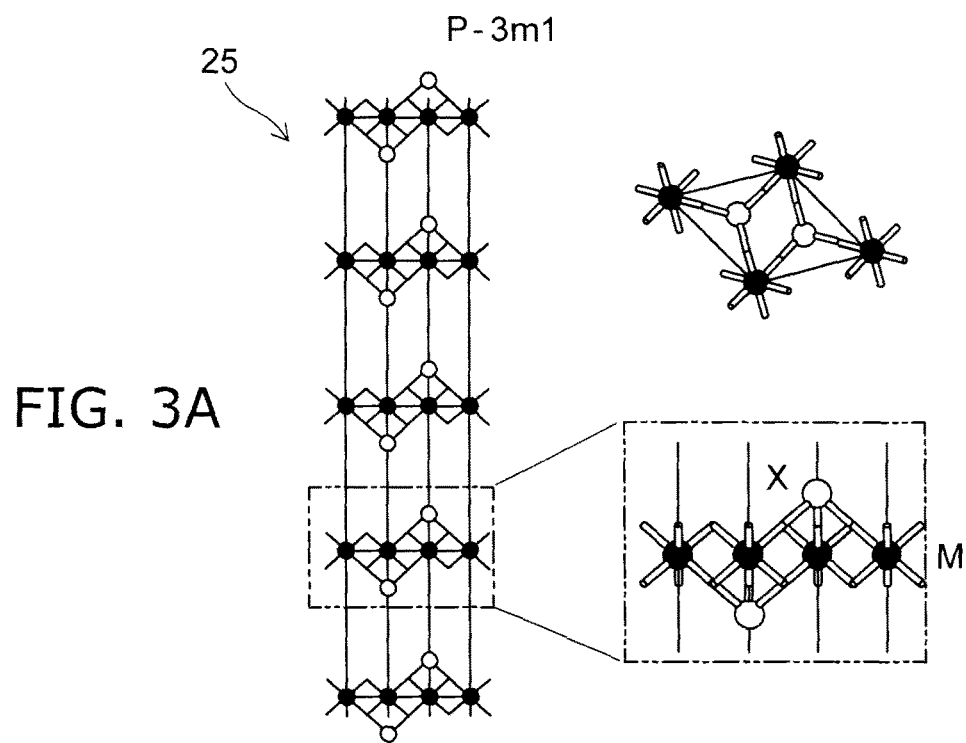
FIG. 3A is a view showing a crystal structure of an interface layer according to the first embodiment.
Figure 3B:
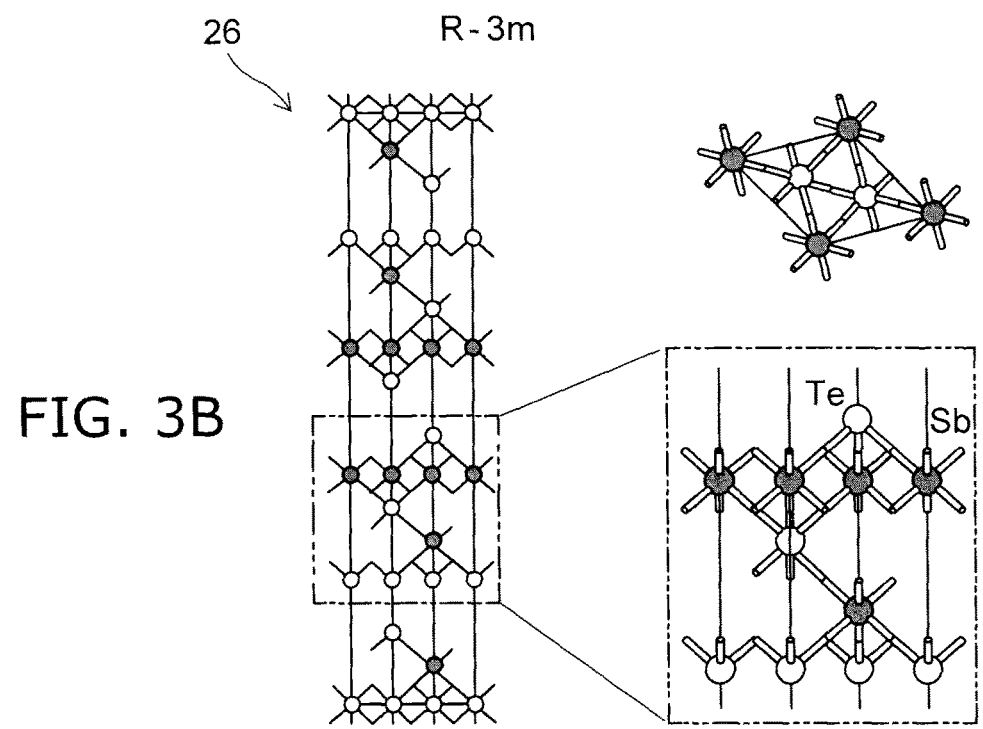
FIG. 3B is a view showing a crystal structure of a portion of a resistance change layer including antimony (Sb) or bismuth (Bi)

The right upper drawing in each of FIG. 3A and FIG. 3B is the drawing in which the structure shown in the left drawing is viewed from above, and the right lower drawing is a partially enlarged view of the left drawing. The left drawing of FIG. 3A shows a crystal structure of five layers.

As shown in FIG. 3A, the crystal structure of the chalcogenide compound $MX_2$ included in the interface layer 25 belongs to a (P-3m1) space group. The crystal structure of the chalcogenide compound $MX_2$ is layered, and the thickness of one layer is about 0.7 nm. Thus, in order to cause the interface layer 25 to have the structure expressed by the chemical formula $MX_2$, the thickness of the interface layer 25 is preferably one layer or more, thus 0.7 nm or more. On the other hand, if the interface layer 25 becomes excessively thick, high integration of the memory device 1 is impeded. Thus, the thickness of the interface layer 25 is preferably 10 nm or less, and is more preferably 5 nm or less.

Figures 4A, 4B:
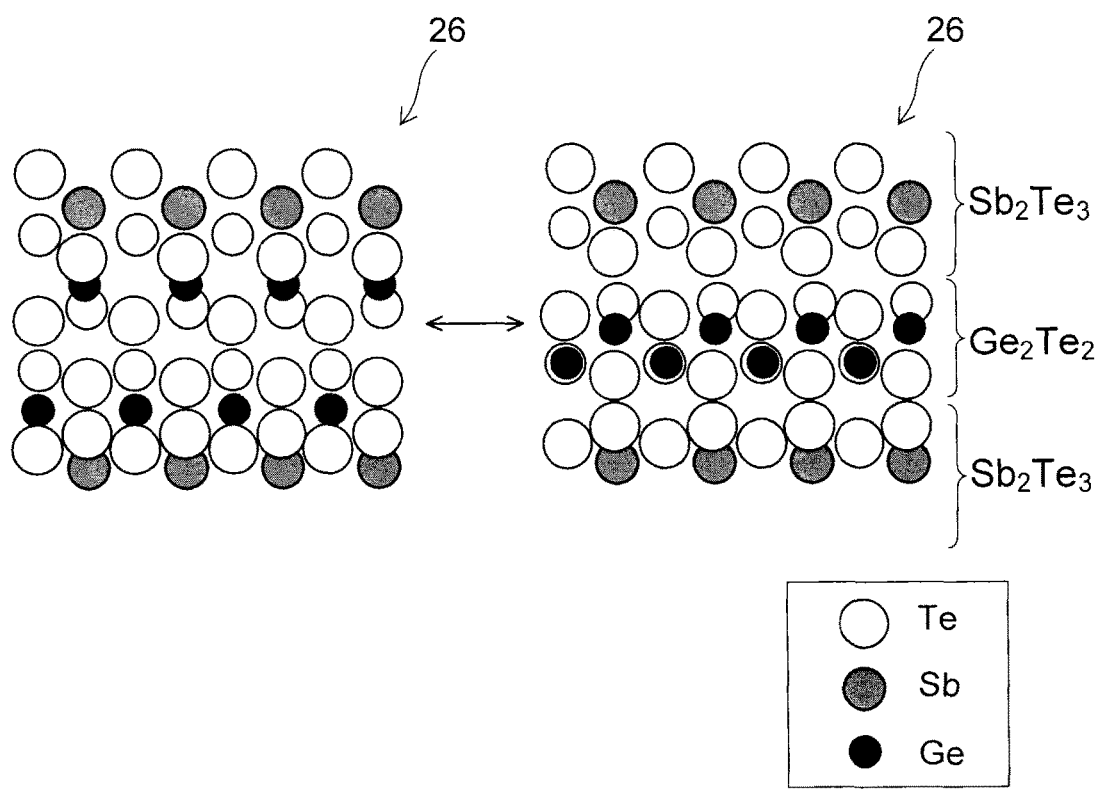
FIG. 4A and FIG. 4B are conceptual views showing an operation model of the resistance change layer according to the first embodiment.

On the other hand, as shown in FIG. 4A and FIG. 4B describe below, the crystal structure of the resistance change layer 26 is a superlattice structure in which a GeTe layer and $Sb_2Te_3$ layer are alternately stacked. Hereinafter, this structure is expressed by "($GeTe/Sb_2Te_3$) superlattice structure". Incidentally, the crystal structure of the resistance change layer 26 may be a superlattice structure (($GeTe/Bi_2Te_3$) superlattice structure) in which a GeTe layer and a $Bi_2Te_3$ layer are alternately stacked. The crystal structure of one of the alloys, which includes antimony or bismuth among the alloys constituting these superlattice structures and contacts the interface layer 25, belongs to a (R-3m) space group as shown in FIG. 3B.

Incidentally, the space groups to which the crystal structures of the interface layer 25 and the resistance change layer 26 belong can be confirmed by, for example, the following method. That is, the interface layer 25 or the resistance change layer 26 is observed by a cross-section transmission electron microscope (TEM) method at such a high magnification that an atom can be identified. A bright-field image is acquired for a square area whose one side has a length of, for example, 5 nm, and this is Fourier transformed with respect to the space. In this way, the space group can be identified.

Next, the operation and effects of the embodiment will be described.

FIG. 4A and FIG. 4B are conceptual views showing an operation model of the resistance change layer in the embodiment.

As shown in FIG. 4A and FIG. 4B, in the memory device 1 of the embodiment, the superlattice structure of the resistance change layer 26, for example, the ($GeTe/Sb_2Te_3$) superlattice structure changes when electric field is applied. The resistance value of the resistance change layer 26 is changed by this, and data can be stored.

In the state shown in FIG. 4A, the two kinds of layers are close to each other. While in the state shown in FIG. 4B, the two kinds of layers are phase-separated. As shown in FIG. 4A and FIG. 4B, the crystal structure of the GeTe layer changes a lot at the phase change. On the other hand, the $Sb_2Te_3$ layer stably exists, and the crystal structure change of the $Sb_2Te_3$ layer is small before and after the phase change. Thus, the superlattice structure is not broken by the phase change, and the stable characteristic can be kept. Similarly to the $Sb_2Te_3$ layer, the $Bi_2Te_3$ layer also maintains the stable structure by itself.

As stated above, the crystal structure of the resistance change layer 26 is the superlattice structure, and the two different crystals can be controlled by electric field or Joule heat. This is different from conventional PCM, and does not pass through an amorphous state. Thus, switching can be performed by a small current without crystal melting. Besides, when the resistance change layer 26 is micronized, the phase transition volume at the electric field application becomes small, so that power saving is achieved.

Besides, as shown in FIG. 3A and FIG. 3B, the (P-3m1) space group to which the crystal structure of the interface layer 25 belongs is similar to the (R-3m) space group to which the crystal structure of one of the two kinds of alloys constituting the resistance change layer 26, which includes antimony or bismuth and contacts the interface layer 25. Thus, the crystal lattice of the interface layer 25 and the crystal lattice of the resistance change layer 26 have good matching with each other, and mismatch is low. Hereinafter, this point will be described.

Figure 5A:
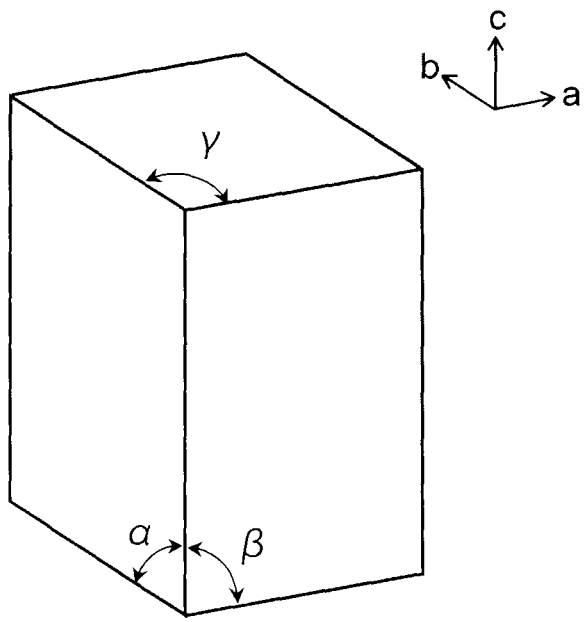
FIG. 5A is a view showing a relation of a crystal lattice, crystal axes, and crystal angles.
Figure 5B:
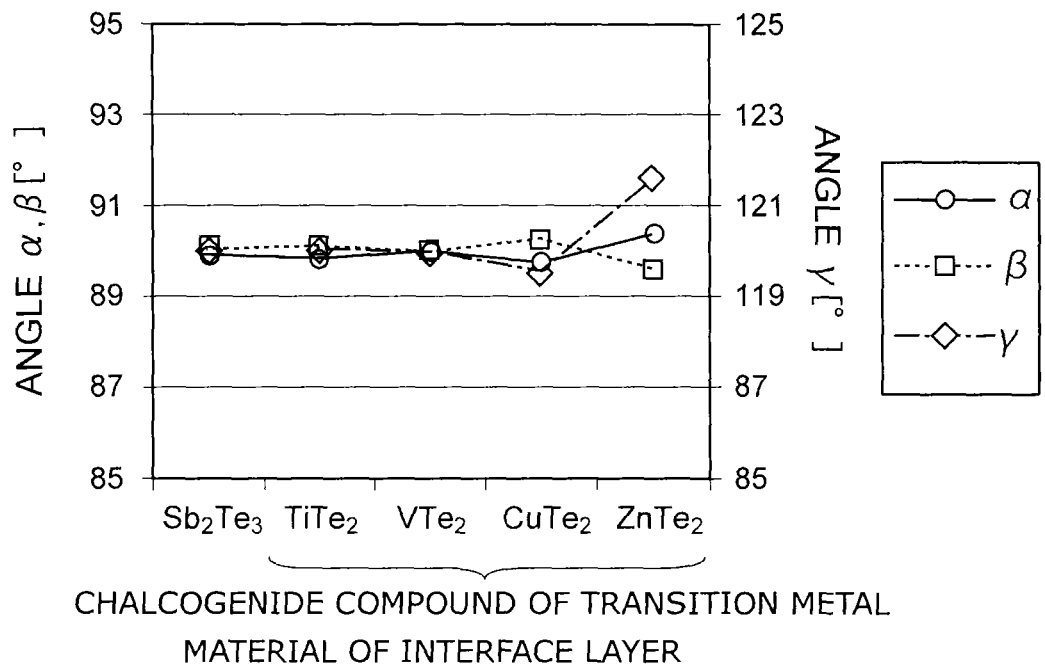
FIG. 5B is a graph in which a horizontal axis indicates a material of the interface layer and a vertical axis indicates angles α, β and γ shown in FIG. 5A, and which shows crystal angle distortion caused when the interface layer is connected to the resistance change layer having the (GeTe/$Sb_2Te_3$) superlattice structure.

FIG. 5A is a view showing a general relation of crystal axes and crystal angles. FIG. 5B is a graph in which the horizontal axis indicates the material of the interface layer and the vertical axis indicates angles α, β and γ shown in FIG. 5A, and which shows crystal angle distortion caused when the interface layer is connected to the resistance change layer having the ($GeTe/Sb_2Te_3$) superlattice structure.

As shown in FIG. 5B, when the material of the interface layer 25 is $TiTe_2$, $VTe_2$, $CuTe_2$ or $ZnTe_2$, similarly to the case of $Sb_2Te_3$, even when the interface layer is connected to the resistance change layer 26 having the ($GeTe/Sb_2Te_3$) superlattice structure, the crystal angle distortion is low, and the crystal orientation is not broken. Thus, when the interface layer 25 is used as the foundation layer when the resistance change layer 26 is formed, the resistance change layer 26 having the superlattice structure excellent in orientation can be formed. Besides, since the mismatch of the crystal lattice is low, the stress generated at the interface between the interface layer 25 and the resistance change layer 26 is low, and the interface layer 25 and the resistance change layer 26 are hard to be peeled off from each other.

Further, in this embodiment, the silicon oxide film 20 and the interface layer 25 are also hard to be peeled off from each other. Hereinafter, this effect will be described in detail.

Figure 6A:
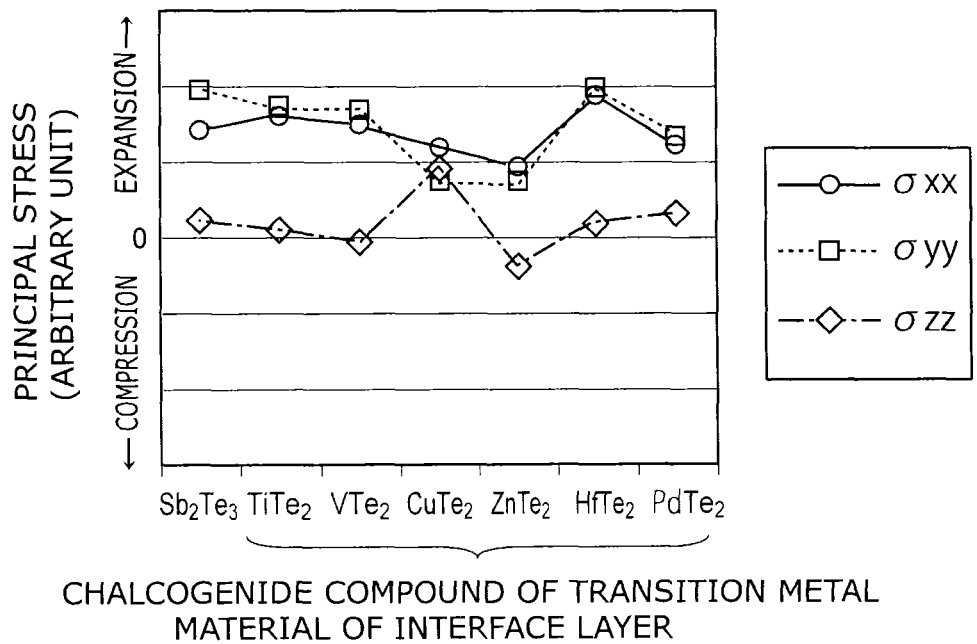
FIG. 6A and FIG. 6B are graphs in which a horizontal axis indicates the material of the interface layer and a vertical axis indicates a stress between the interface layer from and a silicon oxide film, and the vertical axis of FIG. 6A indicates principal stress (main stress), and the vertical axis of FIG. 6B indicates shearing stress.
Figure 6B:
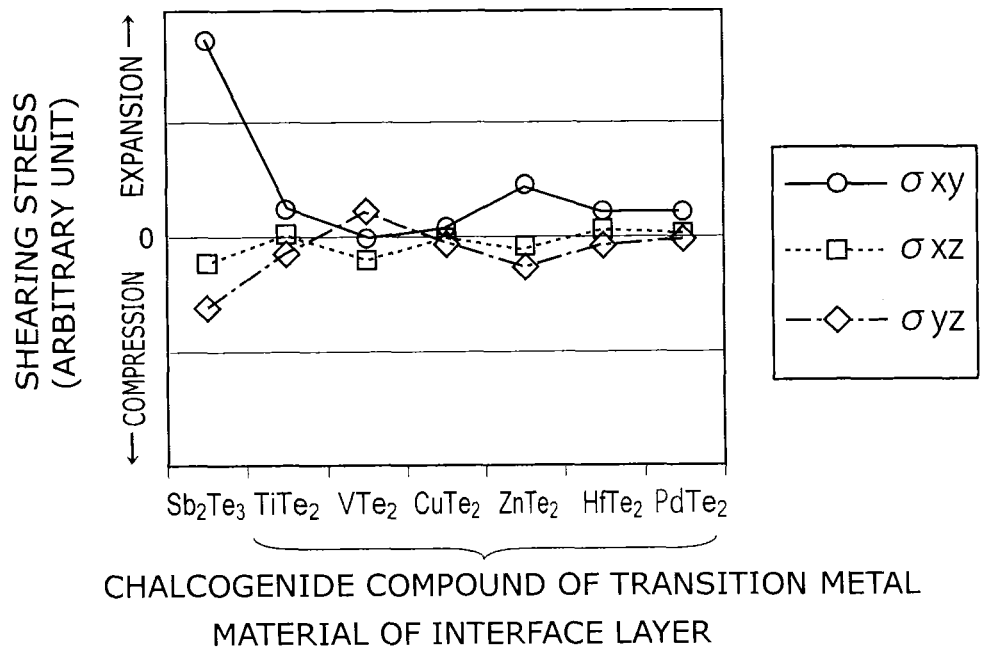

FIG. 6A and FIG. 6B are graphs in which the horizontal axis indicates the material of the interface layer and the vertical axis indicates the stress acting on the interface layer from the silicon oxide film, and which shows the influence of the material of the interface layer exerted on the stress. The vertical axis of FIG. 6A indicates principal stress (main stress), and the vertical axis of FIG. 6B indicates shearing stress.

Incidentally, σxx and σyy shown in FIG. 6A denote principal stress acting in a direction parallel to the interface between the silicon oxide film and the interface layer, and σzz denotes principal stress acting in a direction perpendicular to the interface. Besides, σxy shown in FIG. 6B denotes shearing stress acting in a direction parallel to the interface, and σxz and σyz denote shearing stress acting in a direction perpendicular to the interface. The respective stresses shown in FIG. 6A and FIG. 6B are calculated from first principle calculation. With respect to the respective stresses shown in FIG. 6 and FIG. 6B, the state of the objective interface is made optimized structure by the first principle calculation using a calculation code CASTEP based on a plane wave base. In the calculation, the generalized gradient approximation (CGA) is used as an approximation to the exchange-correlation term, and the ultra-soft type is used to pseudo potential.

As shown in FIG. 6A, the principal stress generated between the silicon oxide film and the interface layer is stably low irrespective of the material of the interface layer, and the influence of the material of the interface layer exerted on the principal stress is low. On the other hand, as shown in FIG. 6B, the shearing stress σxy generated when the material of the interface layer is $Sb_2Te_3$ is extremely large as compared with the shearing stress σxy generated when the material of the interface layer is the chalcogenide compound of the transition metal, specifically, $TiTe_2$, $VTe_2$, $CuTe_2$, $ZnTe_2$, $HfTe_2$ or $PdTe_2$. In other words, when the material of the interface layer is the chalcogenide compound of the transition metal, the stress generated between the interface layer and the foundation silicon oxide film is low, and the layer is hard to be peeled.

As described above, in the memory device 1 of the embodiment, the interface layer 25 is made of the chalcogenide compound of the transition metal, so that the orientation is not impaired, and the adhesion between the resistance change layer 26 and the foundation silicon oxide film 20 can be increased. Thus, the mechanical strength of the pillar 16 is high. As a result, the manufacture of the memory device 1 is easy, and the reliability after the manufacture is high.

(Second Embodiment)

Next, a second embodiment will be described.

Figure 7:
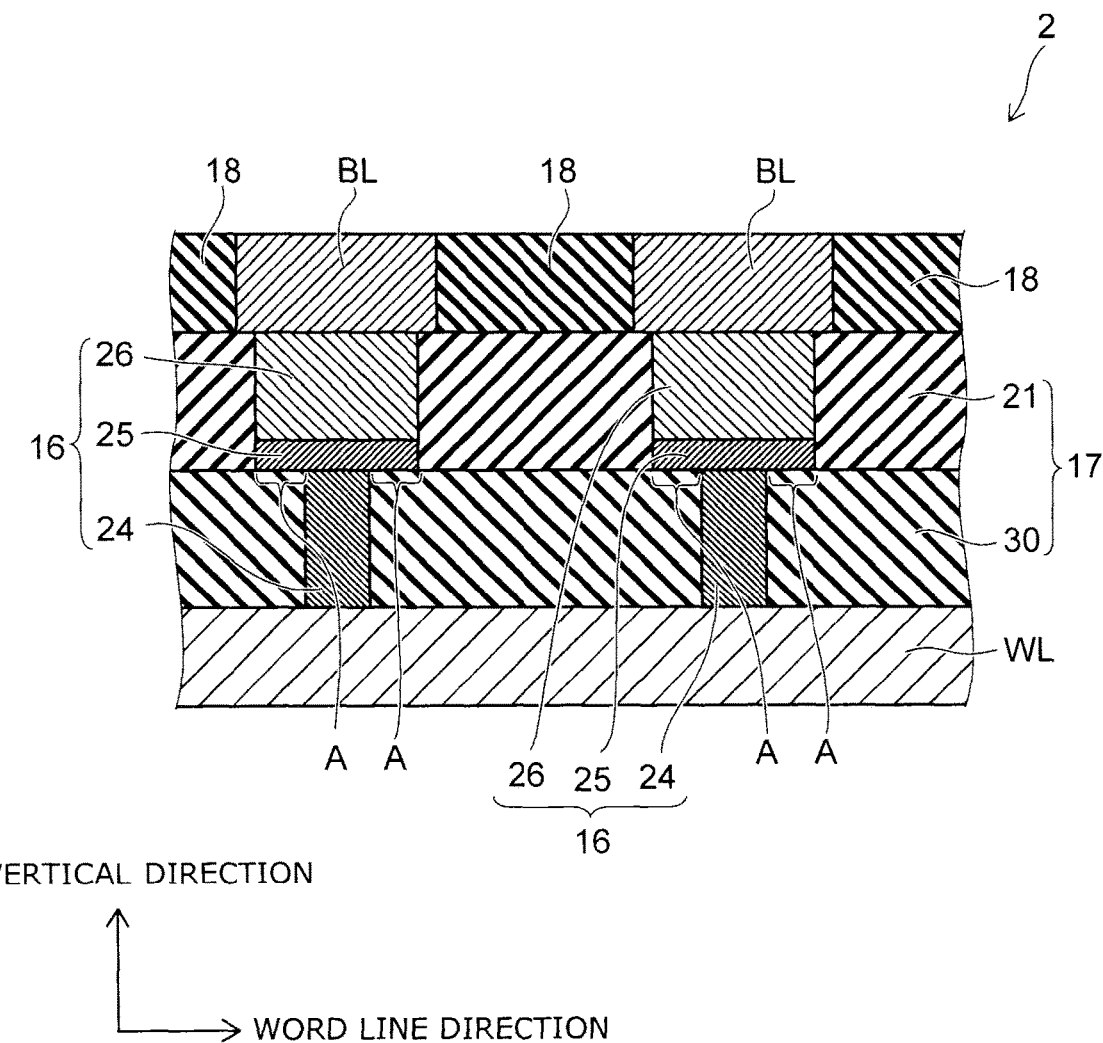
FIG. 7 is a sectional view showing a memory device according to a second embodiment.

FIG. 7 is a sectional view showing a memory device of this embodiment.

As shown in FIG. 7, a memory device 2 of this embodiment is different from the memory device 1 (see FIG. 2) of the first embodiment in that a silicon nitride film 30 is provided instead of the silicon oxide film 20. The silicon nitride film 30 as an insulating layer is made of silicon nitride. The configuration of this embodiment other than the above is the same as that of the first embodiment.

Figure 8A:
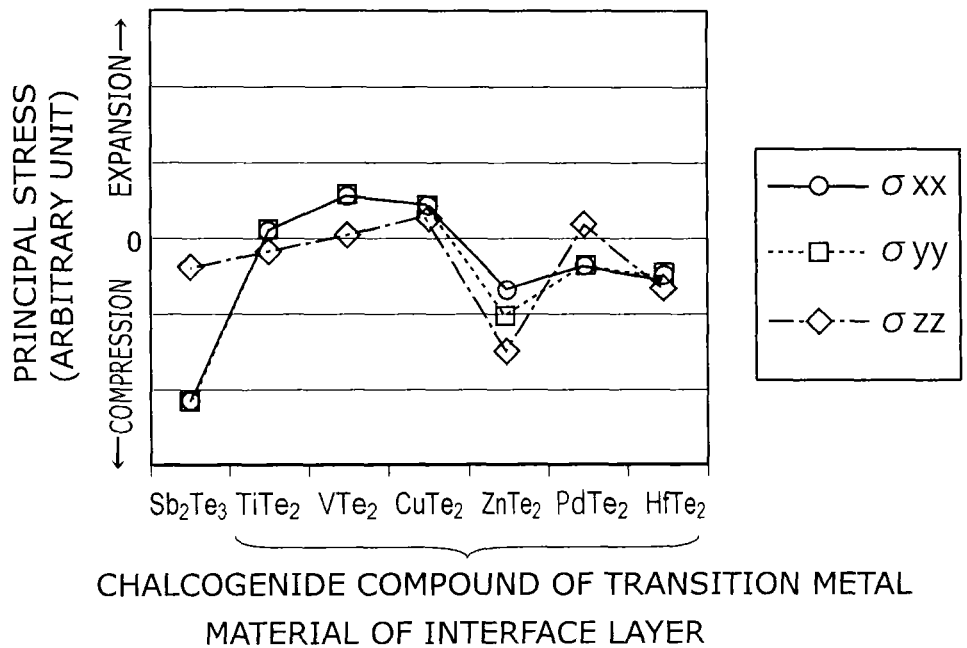
FIG. 8A and FIG. 8B are graphs in which the horizontal axis indicates a material of an interface layer and a vertical axis indicates stress between an interface layer and silicon nitride film, and the vertical axis of FIG. 8A indicates principal stress, and the vertical axis of FIG. 8B indicates shearing stress.
Figure 8B:
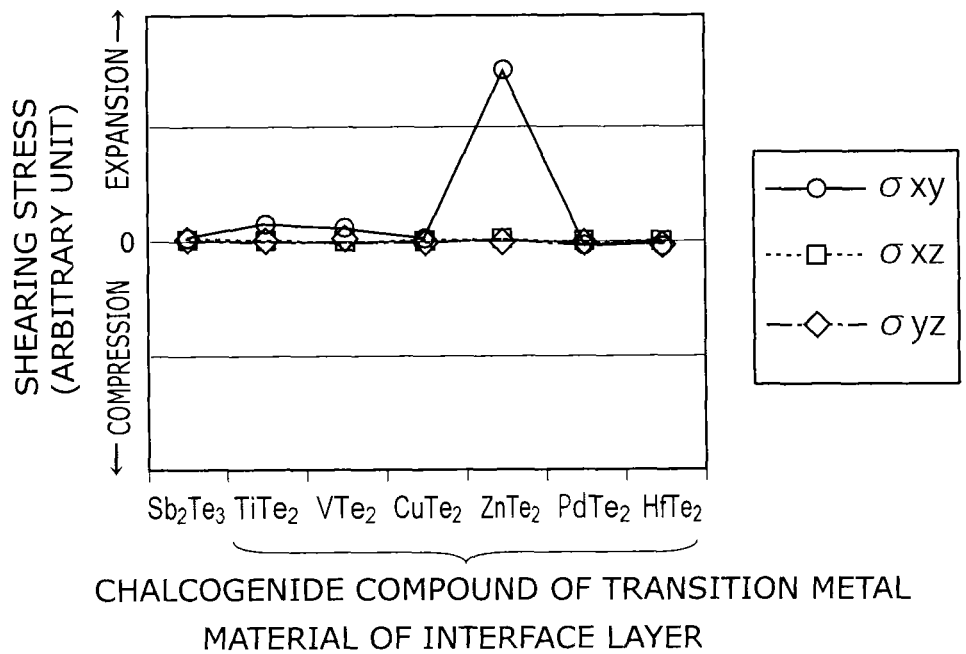

FIG. 8A and FIG. 8B are graphs in which the horizontal axis indicates the material of the interface layer and the vertical axis indicates stress acting on the interface layer from the silicon nitride film, and which shows the influence of the material of the interface layer exerted on the stress. The vertical axis of FIG. 8A indicates principal stress, and the vertical axis of FIG. 8B indicates shearing stress.

As shown in FIG. 8A, the principal stress a yy generated in the compression direction when the material of the interface layer is $Sb_2Te_3$ is larger as compared with the principal stress σyy generated when the material of the interface layer is the chalcogenide compound of the transition metal, for example, $TiT_2$, $VTe_2$, $ZnTe_2$, $PdTe_2$ or $HfTe_2$. Besides, as shown in FIG. 8B, the shearing stresses σxz and σyz are extremely low irrespective of the material of the interface layer. Besides, the shearing stress σxy is extremely low except for the case where the material of the interface layer is $ZnTe_2$.

Thus, when the material of the interface layer is the chalcogenide compound of the transition metal, the stress generated between the interface layer and the foundation silicon nitride film is low, and the silicon nitride film 30 and the interface layer 25 are hard to be peeled off from each other. Especially, when the material of the interface layer is the chalcogenide compound of the transition metal except $ZnTe_2$, that is, $TiTe_2$, $VTe_2$, $CuTe_2$, $PdTe_2$ or $HfTe_2$, the principal stress and the shearing stress are extremely low, and they are more hard to be peeled. The operation and effects of this embodiment other than the above are the same as those of the first embodiment.

(Third Embodiment)

Next, a third embodiment will be described.

Figure 9:
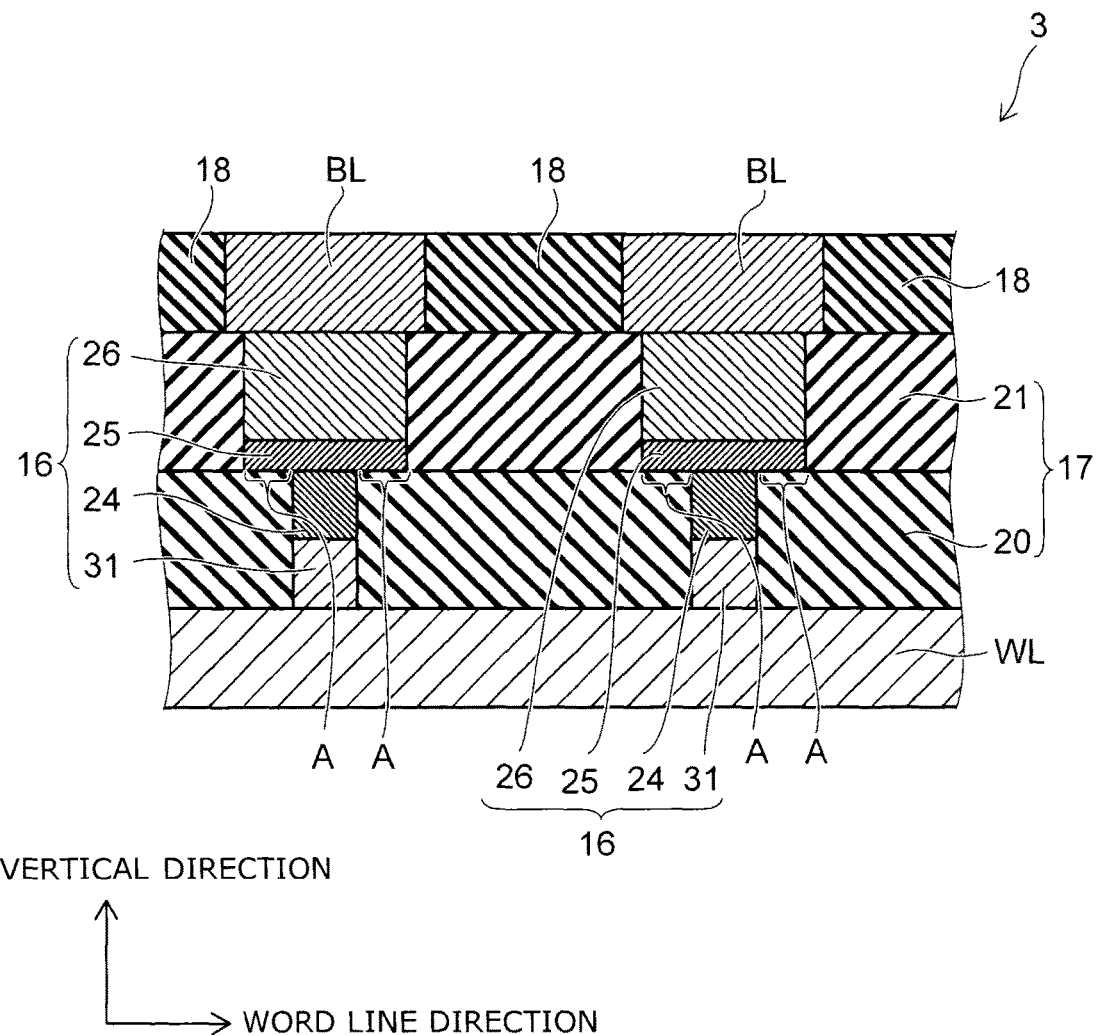
FIG. 9 is a sectional view showing a memory unit of a memory device according to a third embodiment.

FIG. 9 is a sectional view showing a memory unit of a memory device of this embodiment.

As shown in FIG. 9, as compared with the memory device 1 (see FIG. 2) of the first embodiment, in a memory device 3 of this embodiment, an electrode 24 is provided only in an upper layer portion of a silicon oxide film 20, and a diode 31 is provided in a lower layer portion of the silicon oxide film 20. The diode 31 is connected between a word line WL and the electrode 24. The diode 31 is, for example, a pin diode made of silicon.

According to this embodiment, the diode 31 is provided, so that a pillar 16 can be made to have rectification. By this, driving of the memory device 3 becomes easy. The configuration, operation and effects of this embodiment other than the above are the same as those of the first embodiment.

Incidentally, a barrier metal layer may be provided between the word line WL and the diode 31. Besides, the diode 31 has only to be connected in series to a resistance change layer 26 in a portion between a bit line BL and the word line WL, and, for example, may be connected between the resistance change layer 26 and the bit line BL.

(Fourth Embodiment)

Next, a fourth embodiment will be described.

Figure 10:
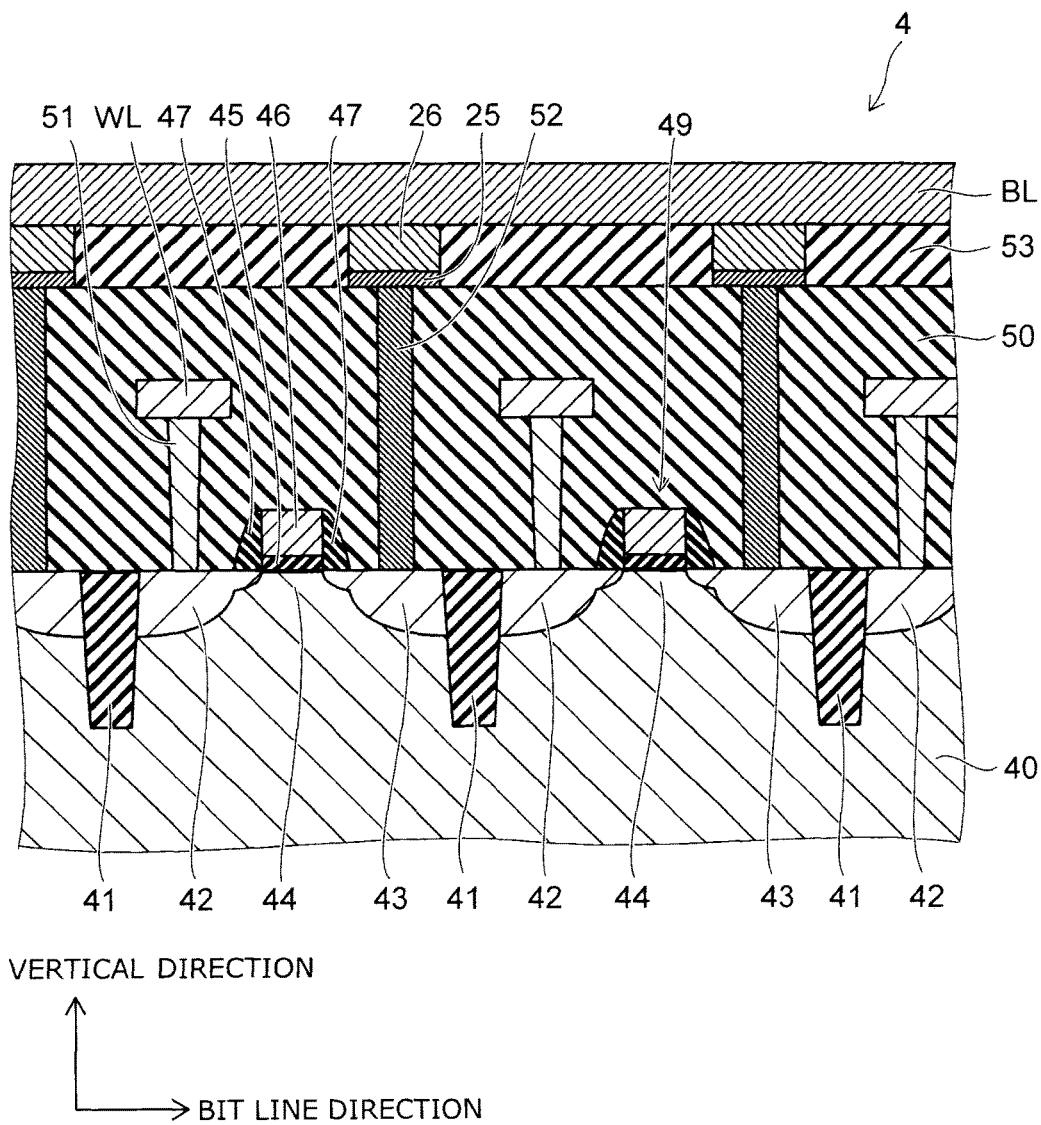
FIG. 10 is a sectional view showing a memory device according to a fourth embodiment.

FIG. 10 is a sectional view showing a memory device of this embodiment.

Figure 11:
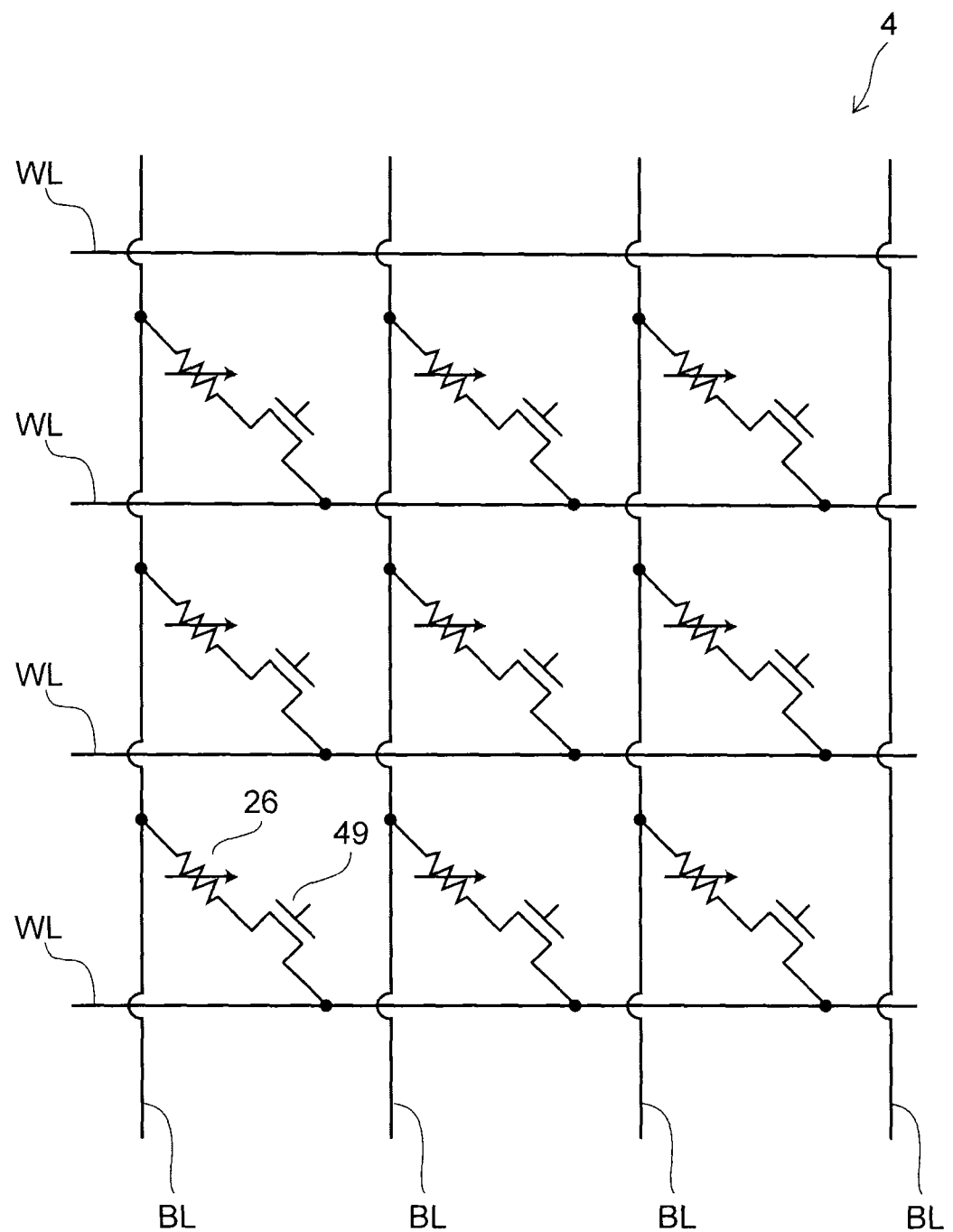
FIG. 11 is a circuit view showing the memory device according to the fourth embodiment.

FIG. 11 is a circuit view showing the memory device of this embodiment.

Although the memory devices of the first to the third embodiments are cross-point type memory devices, the memory device of this embodiment is a 1T1R type memory device.

As shown in FIG. 10, in a memory device 4 of this embodiment, a silicon substrate 40 is provided. STIs (Shallow Trench Isolation) 41 are embedded in an upper layer portion of the silicon substrate 40, and the upper layer portion of the silicon substrate 40 is divided into plural active areas. A source layer 42 and a drain layer 43 are formed in each of the active areas, and a portion between the source layer 42 and the drain layer 43 is a channel region 44. A gate insulating film 45 is provided on the silicon substrate 40 and just on the channel region 44, and a gate electrode 46 is provided thereon. A side wall 47 made of insulating material is provided on a side surface of a stacked body including the gate insulating film 45 and the gate electrode 46. A field effect transistor 49 is formed of the source layer 42, the drain layer 43, the channel region 44, the gate insulating film 45, the gate electrode 46, and the side wall 47.

An interlayer insulating film 50 made of silicon oxide is provided on the silicon substrate 40 so as to cover the gate electrode 46 and the like. A word line WL extending in a word line direction is provided in the interlayer insulating film 50, and is connected to the source layer 42 through a contact 51. Besides, an interface layer 25 and a resistance change layer 26 are stacked on the interlayer insulating film 50. The interface layer 25 is connected to the drain layer 43 through a contact 52. When viewed from the vertical direction, the interface layer 25 is larger than the contact 52. Thus, a part of a lower surface of the interface layer 25 contacts the interlayer insulating film 50 as an insulating layer.

An interlayer insulating film 53 is provided around a stacked body including the interface layer 25 and the resistance change layer 26. A bit line BL extending in a bit line direction is provided on the interlayer insulating film 53 and the resistance change layer 26, and is connected to the resistance change layer 26.

Thus, the bit line BL is connected to the word line WL through the resistance change layer 26, the interface layer 25, the contact 52, the drain layer 43, the channel region 44, the source layer 42 and the contact 51.

As a result, as shown in FIG. 11, in the memory device 4 of this embodiment, one memory cell (the resistance change layer 26) and the one transistor 49 are connected in series between the bit line BL and the word line WL.

Also in this embodiment, the same effects as those of the first embodiment can be obtained.

Incidentally, the foregoing respective embodiments can be mutually combined and carried out. For example, in the third embodiment, the silicon nitride film 30 may be provided instead of the silicon oxide film 20 similarly to the second embodiment. Besides, in the fourth embodiment, the interlayer insulating film 50 may be made of silicon nitride.

Besides, a silicon oxynitride film may be used instead of the silicon oxide film 20 in the first embodiment and the silicon nitride film 30 in the second embodiment. Further, a film whose base material is a silicon oxide film, a silicon oxynitride film or a silicon nitride film and which includes an additive element may be used.

Moreover, in the foregoing respective embodiments, although the layer having the (GeTe/Sb$_2$Te$_3$) superlattice structure or the (GeTe/Bi$_2$Te$_3$) superlattice structure is the resistance change layer 26, no limitation is made to this. The layer having the (GeTe/Sb$_2$Te$_3$) superlattice structure or the (GeTe/Bi$_2$Te$_3$) superlattice structure may, for example, an interconnection. Spin selectivity to cause an electron having a specific spin to be preferentially conducted can be imparted to the interconnection by applying a magnetic field to the interconnection.

According to the embodiments described above, the memory device which is easily manufactured and has high reliability can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
   an insulating layer containing silicon;
   an interface layer provided on the insulating layer, the interface layer being in contact with the insulating layer, and the interface layer consisting of a chalcogenide compound of a transition metal; and
   a conductive layer provided on the interface layer, the conductive layer containing antimony or bismuth, and being in contact with the interface layer, the conductive layer having a superlattice structure,
   wherein a chalcogen element of the chalcogenide compound of the transition metal is one or more elements selected from a group consisting of sulfur, selenium and tellurium.

2. The device according to claim 1, wherein the conductive layer contains a chalcogenide compound.

3. The device according to claim 1, wherein the chalcogenide compound of the transition metal and the conductive layer contain tellurium.

4. The device according to claim 1, wherein the chalcogenide compound of the transition metal is a compound of one or more kinds of transition metals selected from a group consisting of titanium, vanadium, copper, zinc, chromium, zirconium, platinum, palladium, molybdenum, nickel, manganese and hafnium, and one or more kinds of chalcogen elements selected from a group consisting of sulfur, selenium and tellurium.

5. The device according to claim 4, wherein the conductive layer contains a chalcogenide compound.

6. The device according to claim 4, wherein the chalcogenide compound of the transition metal and the conductive layer contain tellurium.

7. The device according to claim 1, wherein a concentration of the transition metal in the interface layer is between 20 atom % and 60 atom %, inclusive.

8. The device according to claim 1, wherein when M denotes a transition metal, and X denotes a chalcogen element, a composition of the interface layer is expressed by a chemical formula MX or MX2.

9. The device according to claim 1, wherein the chalcogenide compound is TiTe2.

10. The device according to claim 1, wherein a crystal structure of the chalcogenide compound belongs to a (P-3m1) space group.

11. The device according to claim 1, wherein a thickness of the interface layer is 0.7 nm or more and 10 nm or less.

12. The device according to claim 1, wherein the insulating layer contains silicon oxide.

13. The device according to claim 1, wherein the insulating layer contains silicon nitride.

14. The device according to claim 1, wherein the conductive layer has a (GeTe/Sb2Te3) superlattice structure.

15. The device according to claim 1, wherein the conductive layer has a (GeTe/Bi2Te3) superlattice structure.

16. The device according to claim 1, wherein the conductive layer is a resistance change layer, resistance value of the resistance change layer changes.

17. The device according to claim 16, further comprising:
a first interconnection extending in a first direction;
a second interconnection extending in a second direction crossing the first direction; and
an electrode,
the electrode, the interface layer, and the conductive layer being connected in series between the first interconnection and the second interconnection, and
the insulating layer being arranged around the electrode and the insulating layer being in contact with a lower surface of the interface layer.

18. The device according to claim 17, further comprising a diode connected in series to the conductive layer between the first interconnection and the second interconnection.

\* \* \* \* \*